United States Patent
Kakumoto et al.

(10) Patent No.: US 7,940,940 B2
(45) Date of Patent: May 10, 2011

(54) MUTING CIRCUIT AND SEMICONDUCTOR INTEGRATED CIRCUIT

(75) Inventors: Yasunobu Kakumoto, Kyoto (JP); Keiichi Fujii, Shiga (JP)

(73) Assignee: Panasonic Corporation, Osaka (JP)

( * ) Notice: Subject to any disclaimer, the term of this patent is extended or adjusted under 35 U.S.C. 154(b) by 1210 days.

(21) Appl. No.: 11/481,158

(22) Filed: Jul. 5, 2006

(65) Prior Publication Data

US 2007/0009110 A1    Jan. 11, 2007

(30) Foreign Application Priority Data

Jul. 8, 2005  (JP) ................................ 2005-200161

(51) Int. Cl.
*H04B 15/00* (2006.01)
*H03F 1/14* (2006.01)
(52) U.S. Cl. ........................................ 381/94.5; 330/51
(58) Field of Classification Search ................ 381/94.5, 381/104, 109, 120; 330/51, 307
See application file for complete search history.

(56) References Cited

U.S. PATENT DOCUMENTS

| 4,633,095 A | 12/1986 | Komatu | |
|---|---|---|---|
| 6,016,352 A * | 1/2000 | Barmore | ..................... 381/94.5 |
| 6,734,746 B1 | 5/2004 | Nogi | |
| 2003/0228024 A1 | 12/2003 | Hayama | |

FOREIGN PATENT DOCUMENTS

| JP | 58-172019 | 10/1983 |
|---|---|---|
| JP | 1-316037 | 12/1989 |
| JP | 9-46149 | 2/1997 |
| JP | 2001-244749 | 9/2001 |
| JP | 2002-111446 | 4/2002 |
| JP | 2002-271217 | 9/2002 |
| JP | 2003-23322 | 1/2003 |
| JP | 2003-318656 | 11/2003 |
| JP | 2004-320490 | * 11/2004 |

* cited by examiner

*Primary Examiner* — Ping Lee
(74) *Attorney, Agent, or Firm* — Hamre, Schumann, Mueller & Larson, P.C.

(57) ABSTRACT

A muting circuit of the present invention includes: an input terminal that receives a control signal for allowing switching between ON and OFF of a mute operation; and a muting transistor connected to the input terminal and an output terminal of the amplifier. The muting transistor is a MOS transistor, and a gate is connected to the input terminal, a drain is connected to the output terminal of the amplifier, and a source is grounded. Consequently, a shot noise due to a DC difference caused when a mute state is switched between ON and OFF can be suppressed.

2 Claims, 6 Drawing Sheets

MUTING CIRCUIT AND SEMICONDUCTOR INTEGRATED CIRCUIT

BACKGROUND OF THE INVENTION

1. Field of the Invention

The present invention relates to a muting circuit that temporarily interrupts an audio output. Further, the invention relates to a semiconductor integrated circuit that includes a transistor capable of muting an audio signal and is driven with a single power source.

2. Description of Related Art

Video devices and acoustic devices including a line-out jack or a headphone jack are mounted with a muting circuit that temporarily interrupts an audio output. In the muting circuit, a shot noise due to a difference in DC potential (hereinafter, referred to as a DC difference) sometimes is output when the circuit is switched from a mute-on state to a mute-off state or from a mute-off state to a mute-on state.

To reduce such a shot noise, a configuration as disclosed in Patent Document 1 (JP 9(1997)-46149 A) has been proposed. In the configuration disclosed in Patent Document 1, an output terminal of an amplifier is grounded temporarily with a bipolar transistor to mute an audio signal, thereby preventing the output of a shot noise.

Meanwhile, in recent years, as portable devices become smaller, it is becoming essential that a transistor capable of muting an audio signal is not mounted singly but is incorporated in a semiconductor integrated circuit. However, in the case where the transistor is formed of a bipolar element, the transistor could have an increased saturation voltage when it is incorporated in the semiconductor integrated circuit, depending on the manufacturing process of the semiconductor integrated circuit. When the saturation voltage of the transistor is increased, a DC difference is caused when a mute state is switched between ON and OFF, resulting in the possibility of generating a shot noise.

Hereinafter, a conventional muting circuit will be described.

Figure 5:
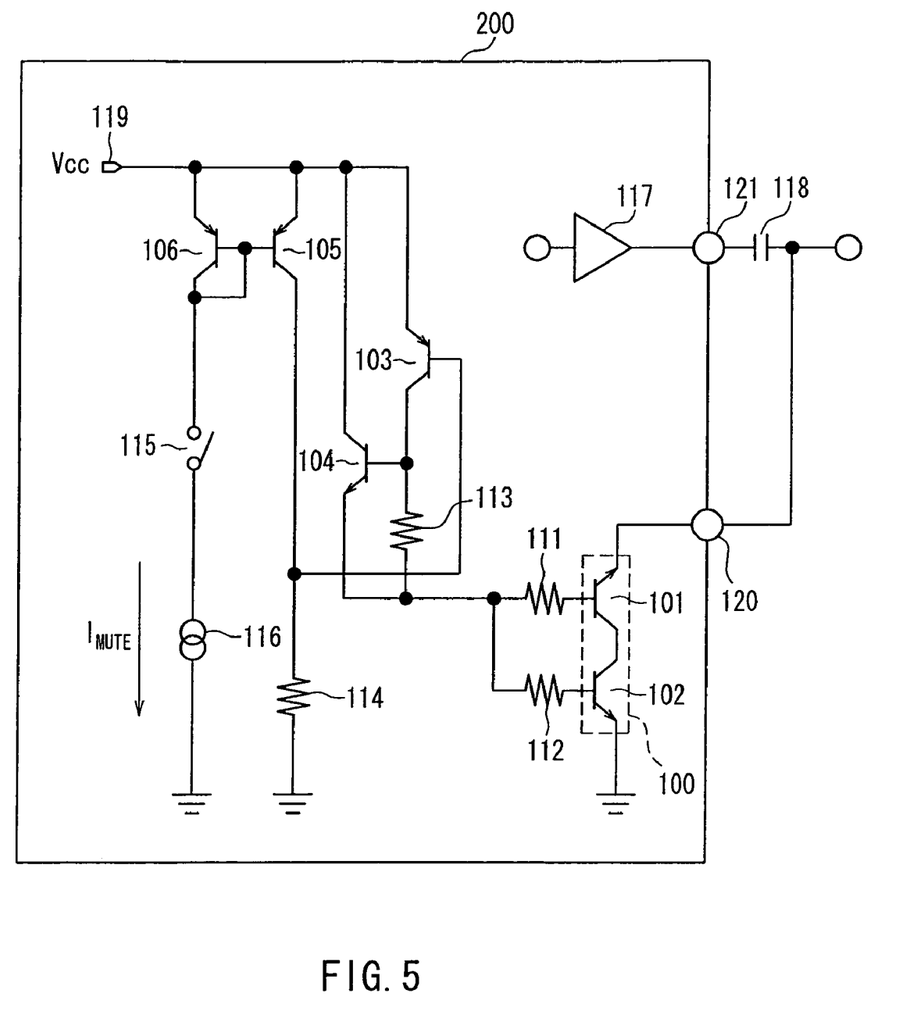
FIG. 5 is a circuit diagram of a conventional muting circuit.

FIG. 5 shows a conventional muting circuit 200. In FIG. 5, a muting transistor unit 100 includes a first transistor 101 and a second transistor 102 that are npn transistors. In the first transistor 101, an emitter is connected to a mute terminal 120, a collector is connected to a collector of the second transistor 102, and a base is connected to a resistor 111. In the second transistor 102, the collector is connected to the collector of the first transistor 101, a base is connected to a resistor 112, and an emitter is grounded.

In a third transistor 103 that is a pnp transistor, an emitter is connected to a power source Vcc, a base is connected to a collector of a fifth transistor 105, and a collector is connected to a base of a fourth transistor 104.

In the fourth transistor 104 that is a npn transistor, a collector is connected to the power source Vcc, the base is connected to the collector of the third transistor 103, and an emitter is connected to the base of the first transistor 101 via the resistor 111 as well as to the base of the second transistor 102 via the resistor 112.

The fifth transistor 105 and a sixth transistor 106 that are pnp transistors constitute a current mirror, in which respective emitters are connected to the power source Vcc. The collector of the fifth transistor 105 is connected to the base of the third transistor 103 and is grounded via a resistor 114. A collector of the sixth transistor 106 is connected to a current source 116 via a switch 115.

An amplifier 117 amplifies an audio signal output from an audio signal processing circuit (not shown) and outputs the same. The amplified audio signal output from the amplifier 117 is output to the outside from an audio output terminal 121 of the semiconductor integrated circuit 200.

Hereinafter, an operation will be described.

In the muting circuit shown in FIG. 5, in a mute-off state, the switch 115 is ON, so that a current $I_{mute}$ flows through the current source 116 and also through the resistor 114. When the current $I_{mute}$ flows through the resistor 114, the third transistor 103 has an increased base voltage, and is turned OFF. Accordingly, the current is not supplied to the base of the fourth transistor 104, so that the fourth transistor 104 also is turned OFF. Because the fourth transistor 104 is turned OFF, the current is not supplied to the bases of the first transistor 101 and the second transistor 102, so that the first transistor 101 and the second transistor 102 are turned OFF. Consequently, the mute terminal 120 has a high impedance, and has no effect on an audio signal output from the audio output terminal 121. Thus, the audio signal output from the audio output terminal 121 is output to a load side.

On the other hand, in a mute-on state, the switch 115 is OFF as shown in FIG. 5, so that the current $I_{mute}$ does not flow. Accordingly, the base voltage of the third transistor 103 is pulled down by the resistor 114, so that the third transistor 103 is turned ON. Because the third transistor 103 is turned ON, the current is supplied to the base of the fourth transistor 104, so that the fourth transistor 104 is turned ON. Because the fourth transistor 104 is turned ON, the current is supplied to the bases of the first transistor 101 and the second transistor 102, so that the first transistor 101 and the second transistor 102 are turned ON. Because the first transistor 101 and the second transistor 102 are turned ON, a capacitor 118 one end of which is connected to the audio output terminal 121 is grounded at the other end. Consequently, the audio signal output from the audio output terminal 121 is not output to the load side.

However, since the first transistor 101 and the second transistor 102 are bipolar transistors, a shot noise could be generated.

More specifically, the bipolar transistors could have an increased saturation voltage. When the saturation voltage is increased, a DC difference is caused when the mute state is switched between ON and OFF, resulting in a shot noise.

Figure 6:
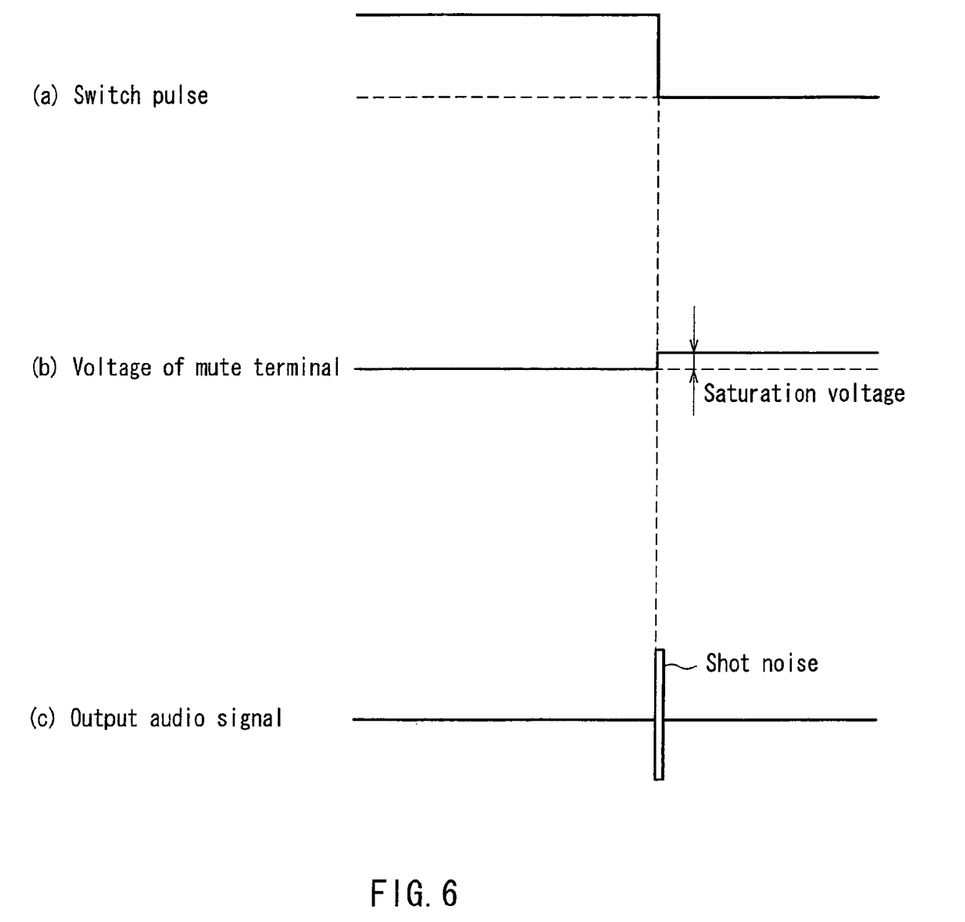
FIG. 6 is a waveform diagram showing a signal waveform when a mute state is switched.

FIG. 6 shows a signal waveform when the mute state is switched in the conventional muting circuit. In FIG. 6, (a) indicates the ON/OFF state of the switch 15, (b) indicates a voltage of the mute terminal 120, and (c) indicates the output audio signal, in an exemplary case where no audio is output. As shown in FIG. 6, when the switch 15 is turned OFF so that the mute state is switched from ON to OFF, the saturation voltage of the muting transistor 100 causes a DC difference in the mute terminal 120 (see (b) in FIG. 6), which results in the generation of a shot noise (see (c) in FIG. 6). The shot noise thus generated is output at an audible volume, making a listener uncomfortable.

SUMMARY OF THE INVENTION

It is an object of the present invention to provide a muting circuit that can suppress a shot noise due to a DC difference caused when a mute state is switched between ON and OFF, and to provide a semiconductor integrated circuit including the muting circuit.

To achieve the above-mentioned object, a muting circuit according to the present invention is capable of temporarily muting an audio signal amplified and output by an amplifier. The muting circuit includes: an input terminal that receives a control signal for allowing switching between ON and OFF of a mute operation; and a muting transistor connected to the input terminal and an output terminal of the amplifier. The muting transistor is a MOS transistor, and a gate is connected to the input terminal, a drain is connected to the output terminal of the amplifier, and a source is grounded.

A semiconductor integrated circuit according to the present invention includes a muting circuit including: an input terminal that receives a control signal for allowing switching between ON and OFF of a mute operation; and a muting transistor connected to the input terminal and an output terminal of the amplifier, wherein the muting transistor is a MOS transistor, and a gate is connected to the input terminal, a drain is connected to the output terminal of the amplifier, and a source is grounded. The semiconductor integrated circuit includes: an audio output terminal capable of connecting with an external circuit, wherein the audio output terminal is connected to the output terminal of the amplifier.

DETAILED DESCRIPTION OF THE INVENTION

The muting circuit according to the present invention further may include a resistor connected to a back gate of the muting transistor, wherein the resistor is connected to the output terminal of the amplifier. With this configuration, in a mute-on state, it is possible to prevent a diode between the back gate and the drain of the muting transistor from being turned ON, and thus to prevent the audio signal from being clipped.

Further, the muting circuit may include: a first resistor and a second resistor connected in series between a reference power source terminal and a ground terminal; a capacitor connected to a connection portion between the first resistor and the second resistor; a fourth transistor whose gate is connected to the connection portion; and a third transistor whose gate is connected to the fourth transistor, wherein the gate of the muting transistor is connected with the third transistor. With this configuration, in conjunction with turning OFF of the device, the muting circuit can be shifted to a mute-on state automatically.

Further, the semiconductor integrated circuit according to the present invention further may include a mute terminal connected to the muting transistor, wherein the mute terminal is connected to the audio output terminal.

According to the present invention, it is possible to suppress a DC difference caused when a mute state is switched between ON and OFF, and thus to suppress a shot noise.

Embodiment 1

Figure 1:
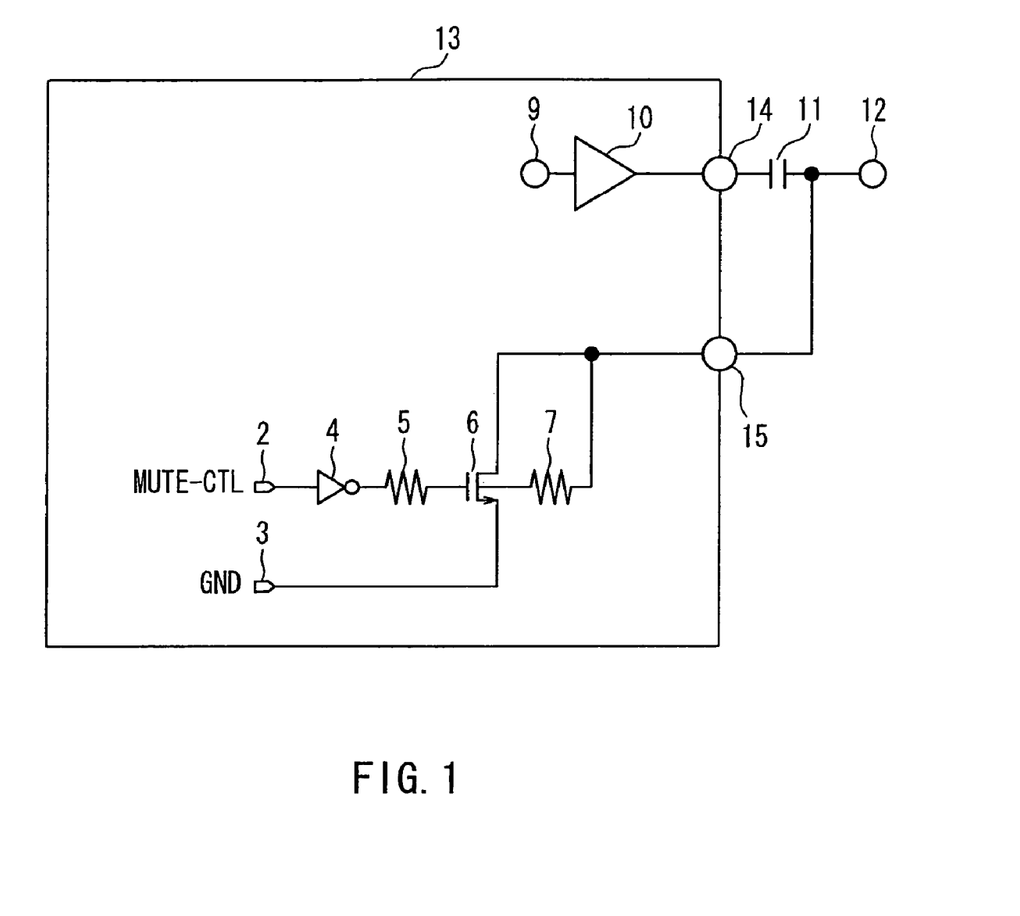
FIG. 1 is a circuit diagram of a muting circuit according to Embodiment 1.

FIG. 1 shows the configuration of a muting circuit according to Embodiment 1. The muting circuit is provided in a semiconductor integrated circuit 13. The semiconductor integrated circuit 13 of the present embodiment is mounted on an audio signal processing circuit in a portable audio device or a camcorder, for example.

In FIG. 1, a terminal 2 is connected with a mute control circuit (not shown) for determining the timing of switching between mute-on and mute-off, and receives a mute control signal (voltage) output from the mute control circuit. The mute control signal is, for example, a signal in synchronization with a key operation timing in the device mounted with the muting circuit.

A muting transistor 6 is an n-channel MOS transistor. In the muting transistor 6, a gate is connected to the terminal 2 via an inverter 4 and a resistor 5, and receives the mute control signal. A drain is connected to a mute terminal 15, a source is grounded, and a back gate is connected to a resistor 7.

The resistor 7 is connected between the back gate of the muting transistor 6 and the mute terminal 15. The resistor 7 prevents a diode between the back gate and the drain of the muting transistor 6 from being ON when a negative signal is input to the mute terminal 15.

An amplifier 10 amplifies an audio signal supplied to a terminal 9, and outputs the same. The audio signal amplified by the amplifier 10 is output from an audio output terminal 14 to a load side via a capacitor 11. The terminal 9 is connected to an audio signal processing circuit (not shown), and is supplied with the analog audio signal.

The semiconductor integrated circuit 13 is an audio signal processing IC in the present embodiment, and includes at least the audio output terminal 14 for outputting the audio signal output from the amplifier 10 to an external load, and the mute terminal 15 connected to an output side of the capacitor 11 for muting the output audio signal. The capacitor 11 may be provided arbitrarily.

An output terminal 12 is connected to the external load such as a headphone, a speaker, another acoustic device, and the like. In the present embodiment, a configuration in which a speaker is connected will be described as an example.

Figure 2:
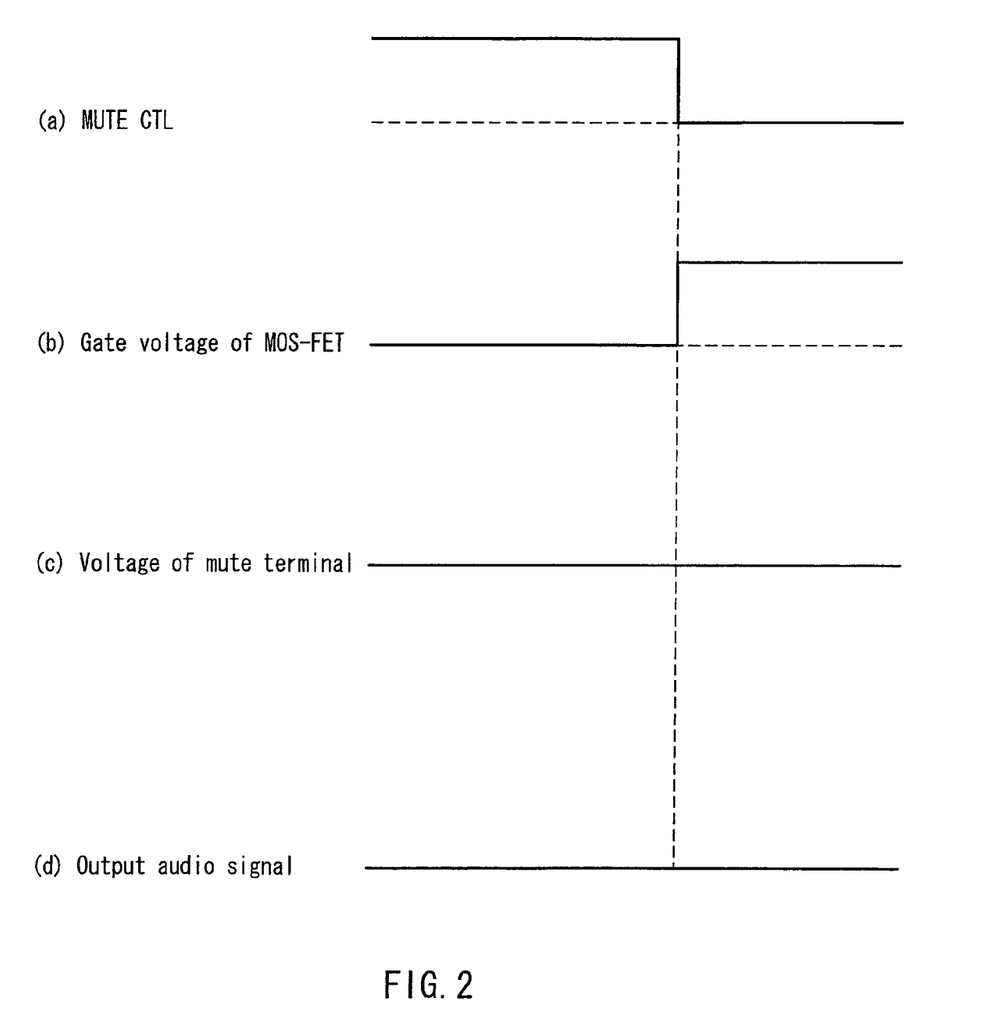
FIG. 2 is a waveform diagram showing a signal waveform when a mute state is switched in Embodiment 1.

FIG. 2 shows a signal waveform when a mute state is switched from OFF to ON in the muting circuit. In FIG. 2, (a) indicates the mute control signal (MUTE-CTL) input from the terminal 2, (b) indicates a gate voltage of the muting transistor 6, (c) indicates a voltage of the mute terminal 15, and (d) indicates the output audio signal. FIG. 2 shows an exemplary case where no audio is output from the amplifier 10.

Hereinafter, an operation will be described.

In FIG. 1, when the mute state is switched from OFF to ON, a Low mute control signal (see (a) in FIG. 2) is input to the terminal 2, and is reversed by the inverter 4. A High mute control signal output from the inverter 4 increases the gate voltage of the muting transistor 6 (see (b) in FIG. 2). Accordingly, the muting transistor 6 is turned ON. When the muting transistor 6 is turned ON, a load-side terminal of the capacitor 11 is grounded via the mute terminal 15. Since the muting transistor 6 is a MOS transistor, it hardly has a saturation voltage, and the voltage of the mute terminal 15 can be at nearly zero as shown in (c) in FIG. 2.

Consequently, the audio signal output from the audio output terminal 14 is not supplied to the output terminal 12, and thus no audio is output from the speaker. In this manner, since no DC difference is caused in the mute terminal 15 when the mute state is switched from OFF to ON, it is possible to suppress the generation of a shot noise as shown in (d) in FIG. 2.

On the other hand, when the mute state is switched from ON to OFF, a High mute control signal is input to the terminal 2, and is reversed by the inverter 4. A Low mute control signal output from the inverter 4 decreases the gate voltage of the muting transistor 6. Accordingly, the muting transistor 6 is turned OFF. When the muting transistor 6 is turned OFF, the mute terminal 15 has a high impedance, and the audio signal output from the audio output terminal 14 is supplied to the external load via the capacitor 11 and the output terminal 12.

The muting circuit shown in FIG. 1 is configured such that the mute terminal 15 is grounded when the muting transistor 6 is turned ON. Thus, there is a need for a configuration for controlling the gate voltage and a back gate voltage of the muting transistor 6. In a mute-off state of the muting circuit, when the back gate has a GND potential, the input of a negative signal to the mute terminal 15 turns ON the diode between the back gate and the drain of the muting transistor 6, and the audio signal is clipped at about −0.7 V.

In order to prevent the clipping of the audio signal, the resistor 7 is connected between the back gate and the mute terminal 15 as shown in FIG. 1. With this configuration, when a negative signal is input to the mute terminal 15, the back gate potential of the muting transistor 6 is decreased to the same level as that of a drain potential, thereby preventing the diode between the back gate and the drain of the muting transistor 6 from being turned ON.

According to the present embodiment, since the muting transistor 6 is a MOS transistor, the drain voltage (saturation voltage) of the muting transistor 6 when it is OFF can be at nearly 0 V. Thus, the voltage of the mute terminal 15 can be at nearly 0 V in the mute-on state. Therefore, a DC difference caused when the mute state is switched from ON to OFF can be suppressed, and thus a shot noise can be suppressed.

Further, since the muting transistor 6 is a MOS transistor, it is possible to make the muting circuit smaller than that including a bipolar transistor.

Further, since the resistor 7 is connected between the back gate of the muting transistor 6 and the mute terminal 15, it is possible to prevent the audio signal from being clipped.

Embodiment 2

Figure 3:
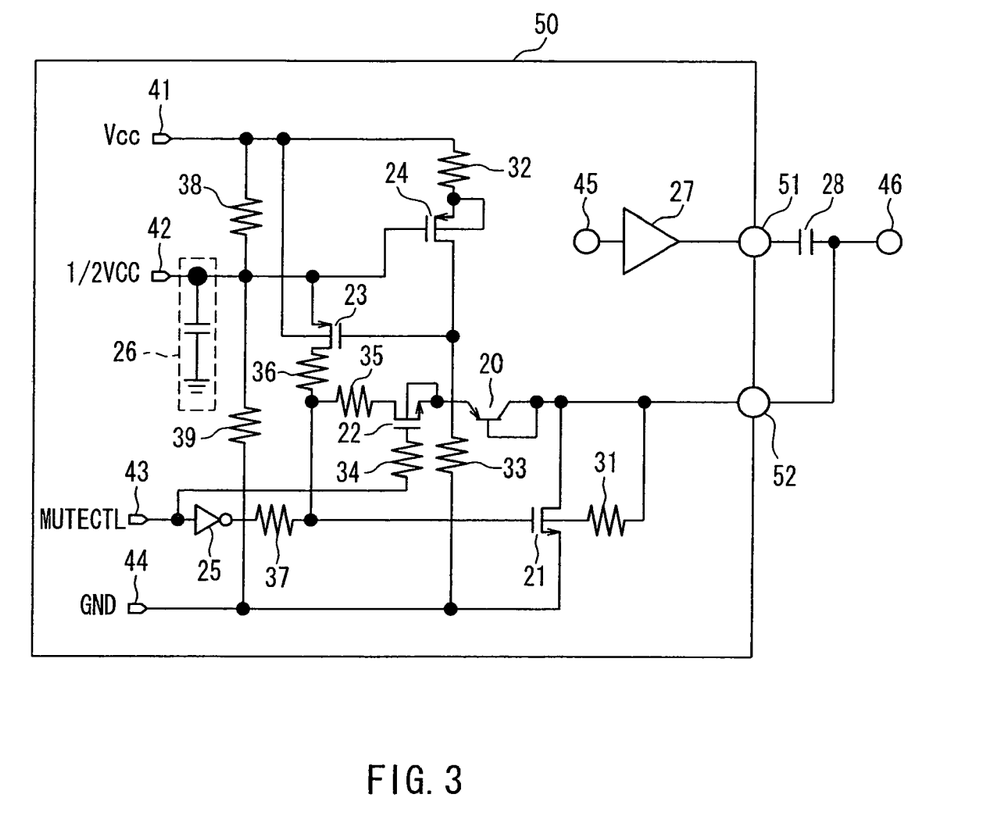
FIG. 3 is a circuit diagram of a muting circuit according to Embodiment 2.

FIG. 3 shows the configuration of a muting circuit according to Embodiment 2. The muting circuit is provided in a semiconductor integrated circuit 50.

In FIG. 3, the muting circuit includes a muting transistor 21, a first transistor 20, a second transistor 22, a third transistor 23, a fourth transistor 24, an inverter 25, a capacitor 26, and resistors 30, 31, 32, 33, 34, 35, 36, 37, 38, and 39. The muting transistor 21, the second transistor 22, the third transistor 23, and the fourth transistor 24 are MOS transistors. The first transistor 20 is a bipolar transistor.

A terminal 41 is supplied with power from a reference power source Vcc. A terminal 42 is supplied with power from a ½ Vcc with a voltage half that of the Vcc. A terminal 43 is connected with a mute control circuit (not shown) for determining the timing of switching between mute-on and mute-off, and receives a mute control signal (MUTE-CTL). The mute control signal is, for example, a signal in synchronization with a key operation timing in a device mounted with the muting circuit.

In the muting transistor 21, a gate is connected to the terminal 43 via the inverter 25 and the resistor 37, and receives the mute control signal. A drain is connected to a mute terminal 52, and a source is grounded.

The resistor 31 is connected to a back gate of the muting transistor 21 so as to prevent a diode between the back gate and the drain of the muting transistor 21 from being ON when a negative signal is input to the mute terminal 52. As a result, an output audio signal is prevented from being clipped at −0.7 V.

An amplifier 27 amplifies an audio signal supplied from a terminal 45 connected with an audio signal processing circuit (not shown), and outputs the same. The audio signal amplified by the amplifier 27 is output from an audio output terminal 51 to a load side via a capacitor 28. The capacitor 28 may be provided arbitrarily.

The semiconductor integrated circuit 50 is an audio signal processing IC in the present embodiment, and includes at least the audio output terminal for outputting the audio signal output from the amplifier 27 to an external load, and the mute terminal 52 connected to an output side of the capacitor 28 for muting the output audio signal.

An output terminal 46 is connected to the external load such as a headphone, a speaker, and the like.

In the present embodiment, the respective component values are set as follows. For example, the resistor 31 has a value of 800 kΩ, the resistor 32 has a value of 1 kΩ, the resistor 33 has a value of 300 kΩ, the resistor 34 has a value of 10 kΩ, the resistor 35 has a value of 1 kΩ, the resistor 36 has a value of 300 kΩ, the resistor 37 has a value of 200 kΩ, the resistor 38 has a value of 600 kΩ, the resistor 39 has a value of 600 kΩ, and the capacitor 26 has a value of 1 μF.

Hereinafter, an operation will be described.

Initially, a description will be given of an operation in a mute-on state or a mute-off state.

In FIG. 3, in a mute-on state, a Low mute control signal is input to the terminal 43, and is reversed by the inverter 25. A High mute control signal output from the inverter 25 is input to the gate of the muting transistor 21 via the resistor 37, so that the muting transistor 21 is turned ON. When the muting transistor 21 is turned ON, a load-side terminal of the capacitor 28 is grounded via the mute terminal 52.

Consequently, the audio signal output from the audio output terminal 51 is not supplied to the output terminal 46, and thus no audio is output from the speaker. In this manner, since no DC difference is caused in the mute terminal 52 when the mute state is switched, it is possible to suppress the generation of a shot noise.

On the other hand, in a mute-off state, a High mute control signal is input to the terminal 43, and is reversed by the inverter 25. A Low mute control signal output form the inverter 25 is input to the gate of the muting transistor 21 via the resistor 37, so that the muting transistor 21 is turned OFF. When the muting transistor 21 is turned OFF, the mute terminal 52 has a high impedance, and the audio signal output from the audio output terminal 51 is supplied to the external load via the capacitor 28 and the output terminal 46.

Next, an operation for preventing the audio signal from being clipped will be described.

In FIG. 3, when the muting transistor 21 is turned OFF (i.e., in a mute-off state), a negative voltage is applied to the mute terminal 52, and the output audio signal may be clipped at −0.7 V.

In the present embodiment, as shown in FIG. 3, the back gate of the muting transistor 21 is connected to the resistor 31, and the resistor 31 is connected to the mute terminal 52. Further, the gate of the muting transistor 21 is connected to the mute terminal 52 via the resistor 35, the second transistor 22, and the first transistor 20. With this configuration, a gate voltage of the muting transistor 21 can be decreased, and thus even when the mute terminal 52 has a negative voltage, a waveform of the output audio signal is prevented from being clipped, and the muting transistor 21 is prevented from being turned ON. More specifically, in the present embodiment, the mute terminal 52 is grounded when the muting transistor 21 is turned ON. Thus, there is a need for a configuration for controlling the gate voltage and a back gate voltage of the muting transistor 21. In a mute-off state, when the back gate has a GND potential, a negative voltage in the mute terminal 52 turns ON the diode between the back gate and the drain of the muting transistor 21. At this time, when a sine wave of 1 $V_{p-p}$, for example, is input, the output audio signal is clipped at about −0.7 V.

In the present embodiment, the back gate and the mute terminal 52 are connected to each other via the resistor. Thus, when a negative signal is input, the back gate potential is decreased to the same level as that of a drain potential, thereby preventing the diode between the back gate and the drain from being turned ON. Consequently, the mute terminal 52 has a high impedance, and has no effect on the output audio signal.

Next, a description will be given of an operation when the semiconductor integrated circuit 50 is switched from ON to OFF.

In FIG. 3, in the semiconductor integrated circuit 50, the capacitor 26 is connected to a node between the resistor 38 and the resistor 39 connected between the Vcc and a GND terminal 44. Due to the connection of the capacitor 26, when the semiconductor integrated circuit 50 is switched from ON to OFF, a voltage of the node between the resistor 38 and the resistor 39 falls gradually from the voltage of the ½ Vcc with a time constant determined by the capacitor 26, the resistor 38, and the resistor 39. In other words, even when the ½ Vcc is turned OFF, the semiconductor integrated circuit 50 is not shifted to an OFF state immediately, but continues to assume an ON state for a while and then is shifted to an OFF state gradually.

When the ½ Vcc is turned OFF, a gate voltage of the third transistor 23 is decreased, so that the third transistor 23 is turned ON. As a result, the muting transistor 21 connected to the third transistor 23 has an increased gate voltage, and is turned ON.

In this manner, when the ½ Vcc is turned OFF, the voltage of the node between the resistor 38 and the resistor 39 falls gradually, and thus the semiconductor integrated circuit 50 is not turned OFF immediately. Therefore, the muting transistor 21 can be ON to assume a mute-on state until the circuit is OFF. As a result, it is possible to suppress a shot noise generated due to bias variations, when the internal circuit is turned OFF, or the like.

As described above, according to the present embodiment, since the muting transistor 21 is a MOS transistor, the drain voltage (saturation voltage) of the muting transistor 21 when it is OFF can be at nearly 0 V. Therefore, a DC difference caused when the mute state is switched from ON to OFF can be suppressed, and thus a shot noise can be suppressed.

Further, since the muting transistor 21 is a MOS transistor, it is possible to make the muting circuit smaller than that including a bipolar transistor.

Further, since the resistor 31 is connected between the muting transistor 21 and the mute terminal 52, it is possible to prevent the output audio signal from being clipped in the mute-off state.

Further, when the semiconductor integrated circuit 50 is turned OFF, the muting circuit detects the power-off condition, and maintains the circuit in an ON state for a while by the capacitor 26, the resistor 38, and the resistor 39 so as to assume a mute-on state. As a result, a shot noise generated when the semiconductor integrated circuit 50 is turned OFF can be suppressed.

Further, when detecting the power-off condition, the muting transistor 21 is turned ON automatically.

Figure 4:
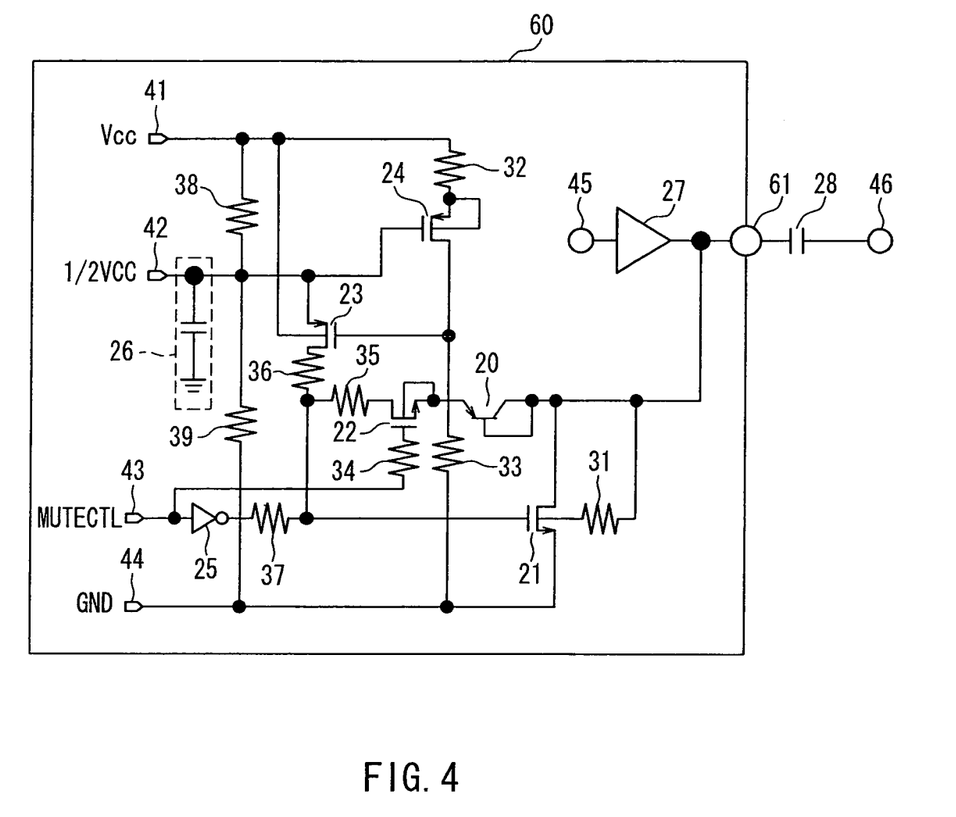
FIG. 4 is a circuit diagram of another muting circuit according to Embodiment 2.

In the configuration shown in FIG. 3, the semiconductor integrated circuit 50 includes the mute terminal 52. However, the muting circuit of the present embodiment can be mounted on a semiconductor integrated circuit without a mute terminal. FIG. 4 shows a configuration of such a semiconductor integrated circuit without a mute terminal. The circuit shown in FIG. 4 is different from that in FIG. 3 in that the mute terminal 52 is not provided, and that the signal lines connected with the drain of the muting transistor 21, the resistor 31, and the like are connected to the output of the amplifier 27. With this configuration, the circuit can be operated in the same manner as in Embodiment 2 and achieve the same effect.

The muting circuit according to the present invention is applied usefully to a configuration in which a muting transistor is incorporated in a semiconductor integrated circuit operated with a single power source. For example, the present invention is suitable for use in portable video devices, such as a camcorder, and portable audio devices.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A muting circuit configured to temporarily mute an audio signal amplified by an amplifier, comprising:
    an input terminal that receives a control signal for allowing switching between ON and OFF of a mute operation;
    a muting transistor connected to the input terminal and an output terminal of the amplifier;
    a first resistor and a second resistor directly connected next to each other in series between a reference power source terminal and a ground terminal;
    a capacitor directly connected to a connection portion between the first resistor and the second resistor;
    a first transistor whose gate is connected to the connection portion; and
    a second transistor whose source is connected to the connection portion, whose gate is connected to the drain of the first transistor, and whose drain is connected to the gate of the muting transistor;
    wherein the muting transistor is a MOS transistor, and
    a gate is connected to the input terminal, a drain is connected to the output terminal of the amplifier, and a source is grounded.

2. The muting circuit according to claim 1, further comprising a resistor connected between a back gate of the muting transistor and the output terminal of the amplifier.

* * * * *